United States Patent
Nagata

(10) Patent No.: US 10,020,463 B2
(45) Date of Patent: *Jul. 10, 2018

(54) DISPLAY DEVICE WITH TACKY LAYER

(71) Applicant: Japan Display Inc., Tokyo (JP)

(72) Inventor: Tetsuya Nagata, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/629,947

(22) Filed: Jun. 22, 2017

(65) Prior Publication Data

US 2017/0288164 A1  Oct. 5, 2017

Related U.S. Application Data

(63) Continuation of application No. 14/809,713, filed on Jul. 27, 2015, now Pat. No. 9,722,203.

(30) Foreign Application Priority Data

Jul. 28, 2014  (JP) ................................. 2014-152517

(51) Int. Cl.
*H01L 51/52*  (2006.01)

(52) U.S. Cl.
CPC .................................. *H01L 51/524* (2013.01)

(58) Field of Classification Search
CPC ........... H01L 51/0545; H01L 51/70036; H01L 51/0541; H01L 51/5012

See application file for complete search history.

(56) References Cited

U.S. PATENT DOCUMENTS

| 7,542,105 | B2 | 6/2009 | Sato et al. |
| 9,722,203 | B2 * | 8/2017 | Nagata ................. H01L 51/524 |
| 2007/0152577 | A1 | 7/2007 | Cho et al. |
| 2015/0015530 | A1 * | 1/2015 | Kim ....................... G06F 3/044 |
| | | | 345/174 |

FOREIGN PATENT DOCUMENTS

JP  2007-183605 A  7/2007

* cited by examiner

*Primary Examiner* — Quoc Hoang
(74) *Attorney, Agent, or Firm* — Typha IP LLC

(57) ABSTRACT

A display device includes a first substrate, a light emitting element located on the first substrate and including a pair of electrodes and one organic layer or a plurality of organic layers located between the pair of electrodes, a second substrate located to face the first substrate, a third substrate located on a surface of the second substrate opposite to a surface thereof facing the light emitting element, and a tacky layer located between the second substrate and the third substrate, a tack strength between the tacky layer and the second substrate or the third substrate being weaker than an adhesive strength between one of the pair of electrodes and the one organic layer or an adhesive strength between the plurality of organic layers.

9 Claims, 14 Drawing Sheets

DISPLAY DEVICE WITH TACKY LAYER

CROSS-REFERENCE TO RELATED APPLICATIONS

This application is a continuation of U.S. patent application Ser. No. 14/809,713, filed on Jul. 27, 2015. Further, this application is based upon and claims the benefit of priority from the prior Japanese Patent Application No. 2014-152517, filed on Jul. 28, 2014, the entire contents of which are incorporated herein by reference.

FIELD

The present invention relates to a display device, and an embodiment disclosed herein relates to a structure of substrates assembled together.

BACKGROUND

Recently, light-emitting display devices for uses in mobile devices are increasingly strongly desired to have higher definition and consume less power. Examples of display devices for uses in mobile devices are liquid crystal display devices (LCDs), display devices using elements for spontaneously emitting light, for example, organic light-emitting diode (OLED) display devices (or organic EL display devices), electronic paper display devices, and the like.

Among the above, organic EL display devices do not require a backlight unit, which is required in liquid crystal display devices, and also use an organic light emitting element driven at a low voltage. For these reasons, organic EL display devices are a target of attention as thin light emitting display devices consuming low power. Especially, top emission-type organic EL display devices using white light emitting elements and color filters for light emission to realize full-color display have been progressively developed. Organic EL display device using color filters do not require a polarizer. The above-described top emission-type organic EL display devices realize both of a higher numerical aperture of pixels and higher definition, and therefore attract a significant attention. The organic EL display devices can be formed merely of thin films, and thus can be made flexible. Such flexible display devices do not use a glass substrate, and therefore are lightweight and are not easily breakable. For these reasons, organic EL display devices attract a lot of attention (e.g., Japanese Laid-Open Patent Publication No. 2007-183605).

SUMMARY

A display device in an embodiment according to the present invention includes a first substrate, a light emitting element located on the first substrate and including a pair of electrodes and one organic layer or a plurality of organic layers located between the pair of electrodes, a second substrate located to face the first substrate, a third substrate located on a surface of the second substrate opposite to a surface thereof facing the light emitting element, and a tacky layer located between the second substrate and the third substrate, a tack strength between the tacky layer and the second substrate or the third substrate being weaker than an adhesive strength between one of the pair of electrodes and the one organic layer or an adhesive strength between the plurality of organic layers.

A display device in an embodiment according to the present invention includes a first substrate, a light emitting element located on the first substrate and including a pair of electrodes and one organic layer or a plurality of organic layers located between the pair of electrodes, a second substrate located to face the first substrate, a third substrate located on a surface of the first substrate opposite to a surface thereof having the light emitting element located thereon, and a first tacky layer located between the first substrate and the third substrate, a tack strength between the first tacky layer and the first substrate or the third substrate being weaker than an adhesive strength between one of the pair of electrodes and the one organic layer or an adhesive strength between the plurality of organic layers.

A display device in an embodiment according to the present invention includes a first substrate having a light emitting element located on a surface thereon, the light emitting element including a pair of electrodes and one organic layer or a plurality of organic layers located between the pair of electrodes, a second substrate located to face the surface of the first substrate having the light emitting element located thereon, and a first tacky layer located between the first substrate and the second substrate and having a thickness of 10 μm or less, a tack strength between of the first tacky layer and the first substrate or the second substrate being weaker than an adhesive strength between one of the pair of electrodes and the one organic layer or an adhesive strength between the plurality of organic layers.

DESCRIPTION OF EMBODIMENTS

Figure 1:
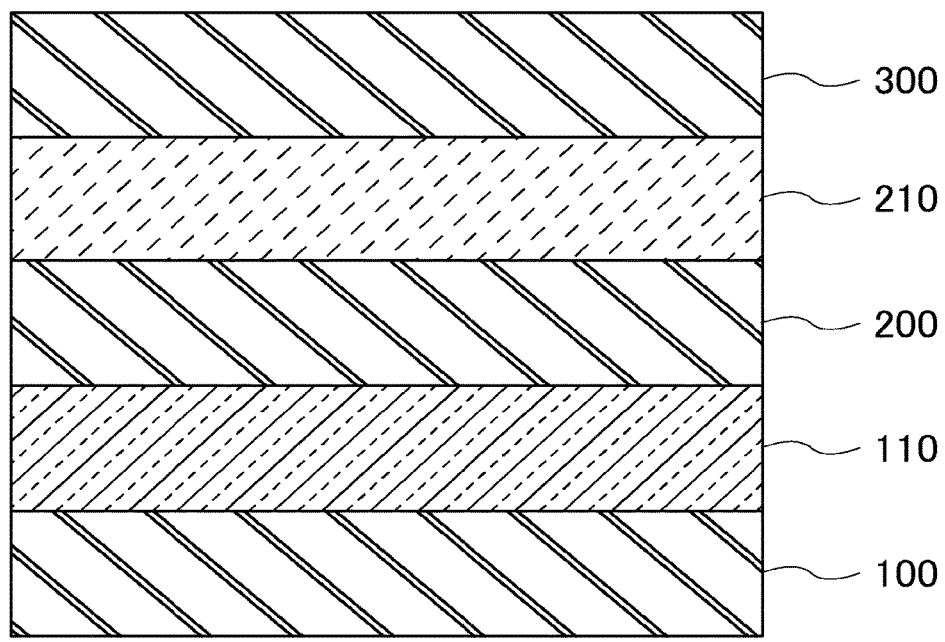
FIG. 1 shows a layer structure of a display device in embodiment 1 according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

<Embodiment 1>

Figure 2:
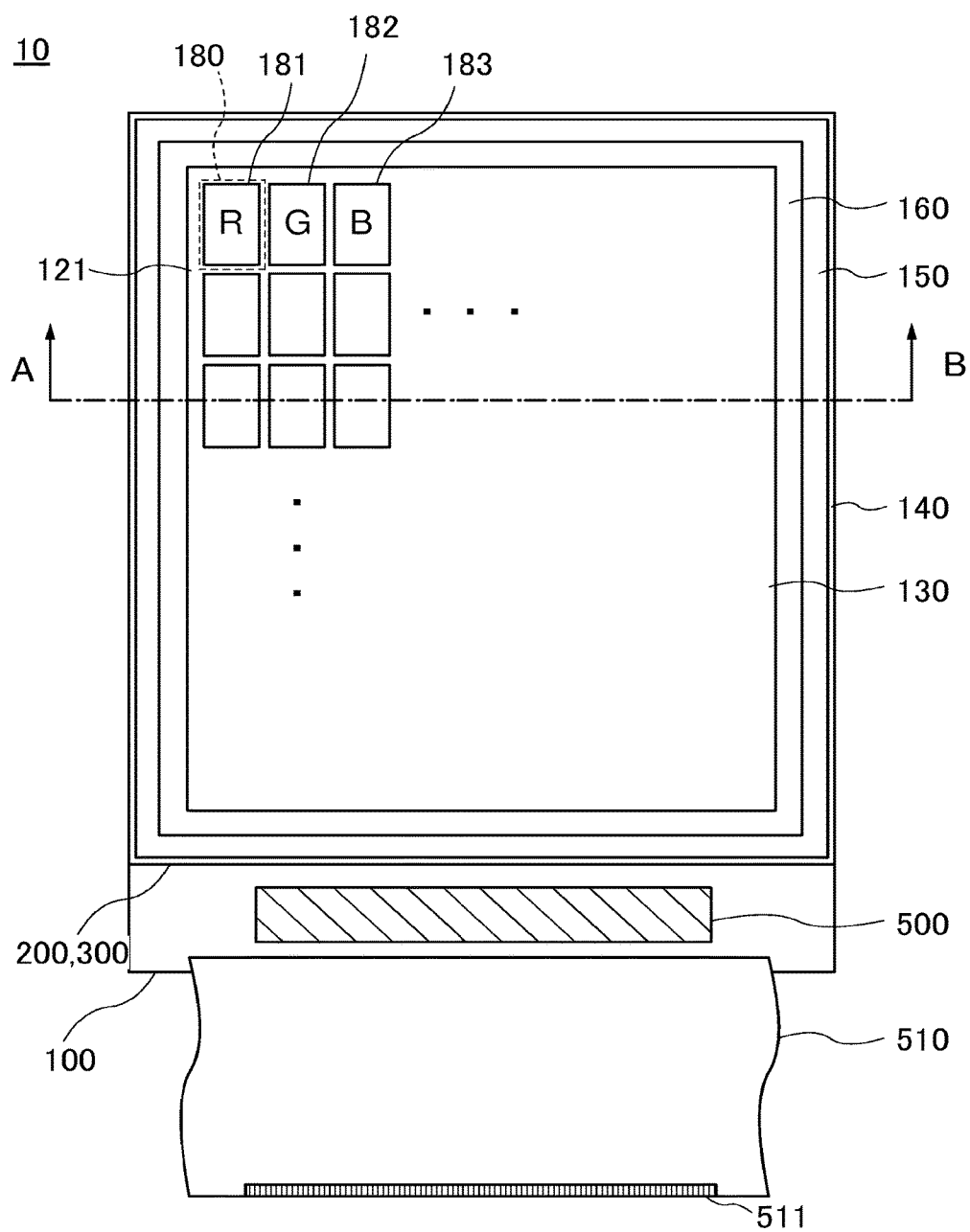
FIG. 2 is a plan view of the display device in embodiment 1 according to the present invention.
Figure 3:
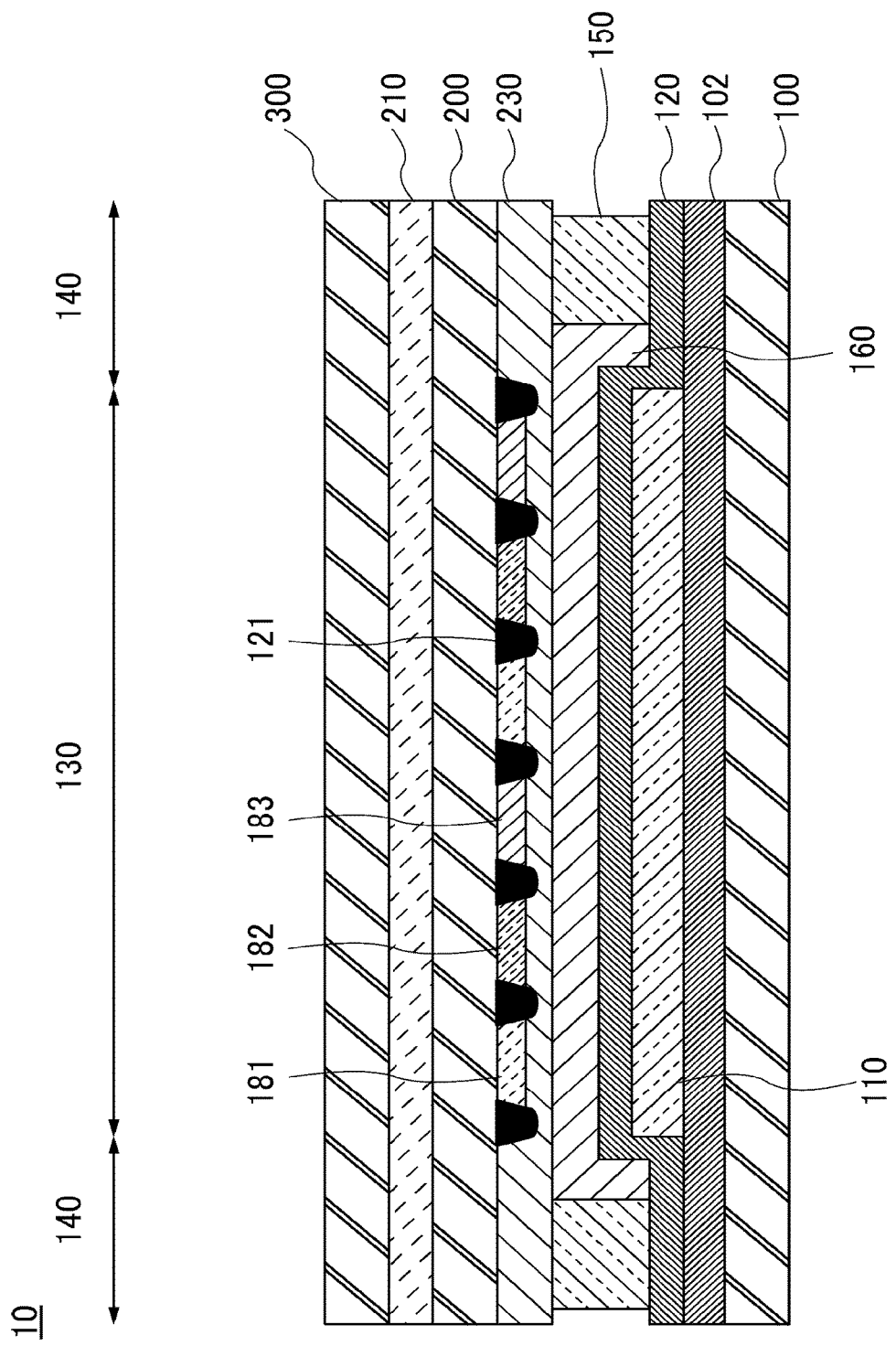
FIG. 3 is a cross-sectional view of the display device in embodiment 1 according to the present invention.

With reference to FIG. 1 through FIG. 3, a layer structure and a device structure of a display device 10 in embodiment 1 according to the present will be described. The display device 10 in embodiment 1 is a top emission-type organic EL display device using a white light emitting element as a light emitting element and also using color filters to realize full-color display (hereinafter, such a structure will be referred to as a "white +CF structure"). In the display device 10, a tacky layer 210 and a third substrate 300 are assembled to a counter substrate on which the color filters (CFs) are provided.

[Structure of the Display Device 10]

FIG. 1 shows a layer structure of the display device 10 in embodiment 1 according to the present invention. As shown in FIG. 1, the display device 10 includes a first substrate 100, a light emitting element 110 located on the first substrate 100, a second substrate 200 located to face the first substrate 100 while having the light emitting element 110 therebetween, a tacky layer 210 located on a surface of the second substrate 200 opposite to a surface thereof facing the light emitting element 110, and the third substrate 300 located to face the second substrate 200 while having the tacky layer 210 therebetween.

The first substrate 100 may be formed of a material durable against a step of forming a transistor layer or the like included in the light emitting element 110. The first substrate 100 may be formed of, for example, a glass substrate or a quartz substrate that is highly resistant against heat and chemicals or a plastic substrate containing impurities in order to be improved in the resistance against heat and chemicals. In a top emission-type organic EL display device as in embodiment 1, light emitted from the light emitting element 110 is output from the third substrate 300. In the case where being included in such a top emission-type organic EL display device, the first substrate 100 does not necessarily need to be highly light-transmissive and may be reflective. In a bottom emission-type organic EL display device, light emitted from the light emitting element 110 is output from the first substrate 100. In the case where being included in such a bottom emission-type organic EL display device, the first substrate is desirably highly light-transmissive.

The first substrate 100 may be formed of a flexible material. Specifically, the first substrate 100 may be formed of a polyimide resin, an acrylic resin or the like. In this case, the first substrate 100 has a thickness of, preferably, 3 μm or greater and 50 μm or less, and more preferably, 5 μm or greater and 20 μm or less. In the case where being included in a top emission-type organic EL display device as in embodiment 1, the first substrate 100 does not necessarily need to be highly light-transmissive as described above. Therefore, the first substrate 100 may contain impurities incorporated thereto in order to, for example, be improved in the resistance against a heat treatment performed in a step of forming a transistor. It causes no problem even if the light transmittance of the first substrate 100 is decreased due to the impurities.

The light emitting element 110 includes a transistor layer and an organic light emitting layer. The transistor layer includes a transistor element and a line. The transistor element may be an amorphous silicon transistor element, a polysilicon transistor element, a single crystalline silicon transistor element, an oxide semiconductor transistor element, an organic semiconductor transistor element or the like. The light emitting element 110 does not necessarily need to include a transistor element. For example, the first substrate 100 may include a line and an organic light emitting layer as in a passive display device.

The organic light emitting layer of the light emitting layer 110 includes a pair of electrodes (upper electrode and lower electrode) and a single layer of an organic material or a stack of a plurality of layers of organic materials. The single layer or the plurality of layers are provided between the pair of electrodes. The organic material may contain, for example, an electron injection material, an electron transfer material, a hole injection material, or a hole transfer material in addition to a light emitting material. The light emitting material in the display device 10 in embodiment 1 may be a while light emitting material including a stack of a plurality of light emitting materials that emit light of different wavelength regions, or may be a single-color light emitting material that emits light of either one of R (red), G (green) and B (blue) wavelength regions.

The second substrate 200 may have the same composition as that of the first substrate 100. In the case where being included in a top emission-type organic EL display device, the second substrate 200 is desirably highly light-transmissive, as opposed to the first substrate 100. By contrast, in the case where being included in a bottom emission-type organic EL display device, the second substrate 200 does not necessarily need to be highly light-transmissive and may be reflective.

The tacky layer 210 is formed of a tacky material. After being attached to another layer and then peeled off therefrom, the tacky material is kept tacky. Herein, a "tacky" material has both liquid and solid nature and is kept wet stably. A tacky material is different from an adhesive material, which is liquid and is solidified after being applied to another material, resulting in adhering thereto. In other words, the "tackiness" indicates a state where the material is not completely dried and is sticky at the surface. Therefore, the tacky layer 210 having tackiness can be attached to another layer without being cured to be solidified. After being attached to another layer, the tacky layer 210 can be peeled off while being kept tacky. For example, even when being attached to another layer and then peeled off therefrom, the tacky layer 210 can be re-attached to the same layer by an external pressure or an own weight thereof to return to the previous state.

As the tacky material, a weakly tacky material is preferable. For example, an acrylic resin-based tacky material and a glass plate react each other strongly, and thus are not easily peeled off. Tacky materials that are weakly tacky and are easily peeled off include, for example, rubber-based tacky materials, urethane-based tacky materials, and polyether-based tacky materials.

In the case where a tacky material is provided on the side of a display device on which display is to be visually recognized, optical characteristics are important. It is desirable to select a tacky material that is transparent and colorless. In the case where a tacky material is provided close to the organic light emitting layer, an emulsion-based tacky material is preferable, not a solvent-based tacky material.

The third substrate 300 may have the same composition as that of the first substrate 100. In the case where being included in a top emission-type organic EL display device, the third substrate 300 is preferably highly light-transmissive, like the second substrate 200. By contrast, in the case where being included in a bottom emission-type organic EL display device, the third substrate 300 does not necessarily need to be highly light-transmissive and may be reflective.

The tack strength between the tacky layer 210 and the second substrate 200 or the third substrate 300 is weaker than the adhesive strength between one of the pair of electrodes and the organic material included in the light emitting element 110. In the case where the light emitting layer 110 includes a stack of a plurality of organic materials, the tack strength between the tacky layer 210 and the second substrate 200 or the third substrate 300 is weaker than the adhesive strength between the plurality of organic materials in the stack. The "tack strength between the tacky layer 210 and the second substrate 200 or the third substrate 300" encompasses the tack strength in the case where another layer is located between the tacky layer 210 and the second substrate 200 or the third substrate 300.

[Device Structure of the Display Device 10]

FIG. 2 is a plan view of the display device 10 in embodiment 1 according to the present invention. Referring to FIG. 2, a structure of the display device 10 including elements such as a driver IC 500, an FPC (Flexible Printed Circuit) 510 and the like, in addition to the layer structure described with reference to FIG. 1, will be described in detail. The display device 10 shown in FIG. 2 is an organic EL display device having a "white +CF structure".

As shown in FIG. 2, the display device 10 in embodiment 1 includes the first substrate 100, the second substrate 200, the third substrate 300 (in FIG. 2, the second substrate 200, the third substrate 300 are shown as if being one substrate), the driver IC 500 and the FPC 510. The driver IC 500 and the FPC 510 are provided on a part of the first substrate 100 that is exposed from the second substrate 200 and the third substrate 300. The FPC 510 includes a terminal 511 connected to a controller circuit that controls a driving circuit.

The first substrate 100 includes pixels 180 in a display area 130. The pixels 180 each include a light emitting element. In FIG. 2, the light emitting element in each pixel 180 emits white light from a top surface thereof (on the side shown in FIG. 2). The second substrate 200 includes a light blocking layer 121 having openings in positional correspondence with the pixels 180, a color filter 181 transmitting light of a red wavelength region, a color filter 182 transmitting light of a green wavelength region, and a color filter 183 transmitting light of a blue wavelength region. The color filters 181, 182 and 183 are respectively provided in the openings. The first substrate 100 and the second substrate 200 are assembled together by a sealing member 150, located in a peripheral area 140 around the display area 130 in which the pixels 180 are located, and also by a filler 160 filling a space inside the sealing member 150.

FIG. 3 is a cross-sectional view of the display device 10 in embodiment 1 according to the present invention, taken along line A-B in FIG. 1. As shown in FIG. 3, the display device 10 in embodiment 1 includes the first substrate 100, an underlying barrier layer 102 that is located on the first substrate 100 and suppresses diffusion of impurities from the first substrate 100, the light emitting element 110 located on a part of the underlying barrier layer 102 that is in the display area 130, and a protective layer 120 located in the display area 130 and the peripheral area 140 so as to cover the light emitting element 110. The protective layer 120 is in contact with the underlying barrier layer 120 in the peripheral area 140 to seal the light emitting element 110. Herein, a surface of the first substrate 100 on which the light emitting element 110 is formed will be referred to as an "upper surface" of the first substrate 100, in consideration of the manufacturing process of the first substrate 100 and the components provided thereon.

The display device 10 also includes the second substrate 200, the light blocking layer 121 that is located on the second substrate 200 and has the openings in positional correspondence with the pixels in the display area 130, the color filters 181, 182 and 183 respectively provided in the openings of the light blocking layer 121, and an overcoat layer 230 located in the display area 130 and the peripheral area 140 so as to cover the light blocking layer 121 and the color filters 181, 182 and 183. The overcoat layer 230 alleviates stepped portions made by the light blocking layer 121 and the color filters 181, 182 and 183. Herein, the surface of the second substrate 200 on which the light blocking layer 121 is formed will be referred to as an "upper surface" of the second substrate 200, in consideration of the manufacturing process of the second substrate 200 and the components provided thereon.

The first substrate 100 and the components provided thereon, and the second substrate 200 and the components provided thereon, are assembled together with the sealing member 150 and the filler 160 such that the upper surfaces thereof face each other. More specifically, the sealing member 150 is in contact with the overcoat layer 230 and the protective layer 120 in the peripheral area 140 to seal the filler 160. The present invention is not limited to having the structure shown in FIG. 3. One layer, or a plurality of layers, among the underlying barrier layer 102, the protective layer 120 and the overcoat layer 230 may be removed from an area where the sealing member 150 is located.

The tacky layer 210 is located on the entirety of the surface of the second substrate 200 opposite to the surface thereof facing the light emitting element 110. The third substrate 300 is located to face the second substrate 200 while having the tacky layer 210 therebetween. FIG. 3 shows a structure in which the tacky layer 210 and the third substrate 300 are located on the entire surface of the second substrate 200. The present invention is not limited to having such a structure. For example, the tacky layer 210 and the third substrate 300 may be located in a part of the display area 130 or the peripheral area 140. FIG. 3 shows a structure in which the tacky layer 210 and the third substrate 300 are formed in the same area. The present invention is not limited to having such a structure. The tacky layer 210 and the third substrate 300 may be located in different areas from each other. In other words, the tacky layer 210 and the third substrate 300 may have different patterns from each other.

The underlying barrier layer 102 and the protective layer 120 may be formed of a silicon nitride film ($SiN_x$ film), a silicon oxide film ($SiO_x$ film), a silicon nitride oxide film ($SiN_xO_y$ film), a silicon oxide nitride film ($SiO_xN_y$ film), an aluminum nitride film ($AlN_x$ film), an aluminum oxide film ($AlO_x$ film), an aluminum nitride oxide film ($AlN_xO_y$ film), an aluminum oxide nitride film ($AlO_xN_y$ film), or the like (x and y each represent an arbitrary value). These films may be stacked to form a stacking structure. The "silicon nitride oxide film" is a silicon nitride film containing oxygen at a lower content than nitrogen. The "silicon oxide nitride film" is a silicon oxide film containing nitrogen at a lower content than oxygen.

As described above, with the display device 10 in embodiment 1 according to the present invention, even if an external impact is applied to the display device 10, the tacky layer 210 is peeled off from the second substrate 200 or the third substrate 300 to alleviate the impact. Thus, one of the electrodes and the organic material are suppressed from being peeled off from each other, or the plurality of organic materials are suppressed from being peeled off from each other. The tacky layer 210 and the second substrate 200 or the third substrate 300, even if being peeled off from each other by the impact, are re-attached to each other. Therefore, the external appearance of the display device 10 is kept normal. This decreases display faults such as light emission faults, non-uniform display or the like, which may be caused by the external impact.

<Modification of Embodiment 1>

Figure 4:
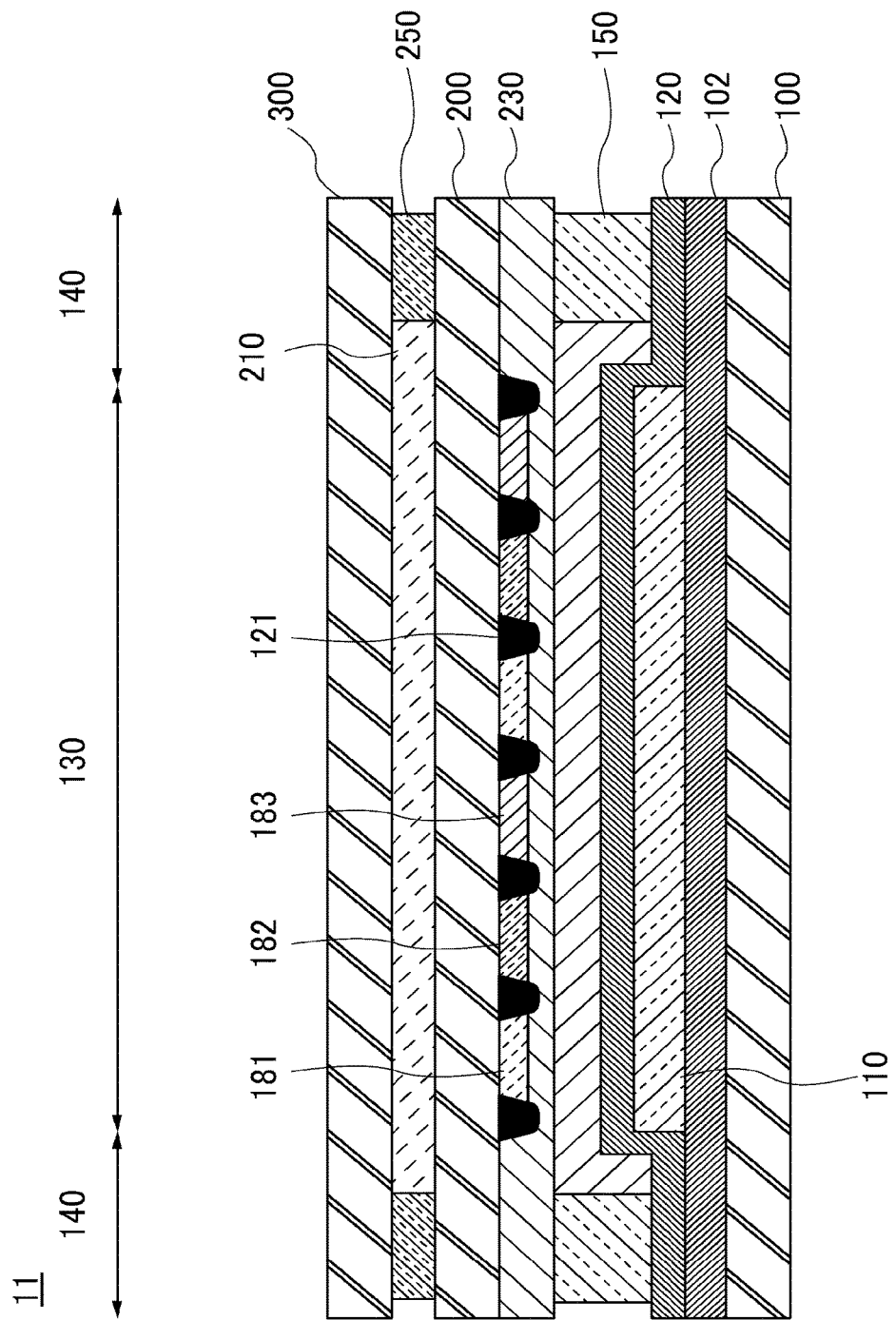
FIG. 4 is a cross-sectional view of a display device in a modification of embodiment 1 according to the present invention.

FIG. 4 is a cross-sectional view of a display device 11 in a modification of embodiment 1 according to the present invention. In the modification of embodiment 1, the second substrate 200 and the third substrate 300 are fixed to each other with an adhesive layer 250.

The display device 11 shown in FIG. 4 is similar to the display device 10 shown in FIG. 3. Unlike the display device 10, however, the display device 11 includes the adhesive layer 250 located between the second substrate 200 and the third substrate 300 so as to enclose the tacky layer 210. Unlike the tacky layer 210, the adhesive layer 250 is cured after the second substrate 200 and the third substrate 300 are assembled together while having the adhesive layer 250 therebetween. Therefore, the second substrate 200 and the third substrate 300 are fixed to each other with the adhesive layer 250. The adhesive layer 250 does not necessarily need to completely enclose the tacky layer 210, and may be located at discrete positions, for example, at four corners of the peripheral area 140. The display device 11 shown in FIG. 4 includes the adhesive layer 250 located in the peripheral area 140 between the second substrate 200 and the third substrate 300. The present invention is not limited to having such a structure. The adhesive layer 250 may be located in the display area 130.

As described above, the display device 11 includes the adhesive layer 250. This increases the force that keeps the second substrate 200 and the third substrate 300 together. Even if, for example, an external impact sufficiently large to peel off the entirety of the tacky layer 210 is applied to the display device 11, the second substrate 200 and the third substrate 300 are kept fixed to each other and thus are prevented from being completely peeled off from each other.

<Embodiment 2>

Figure 5:
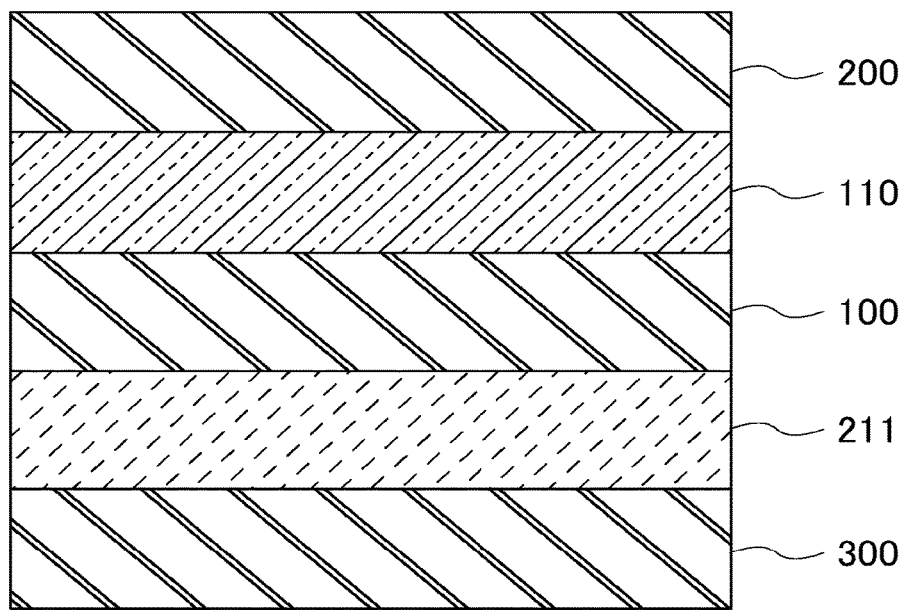
FIG. 5 shows a layer structure of a display device in embodiment 2 according to the present invention.
Figure 6:
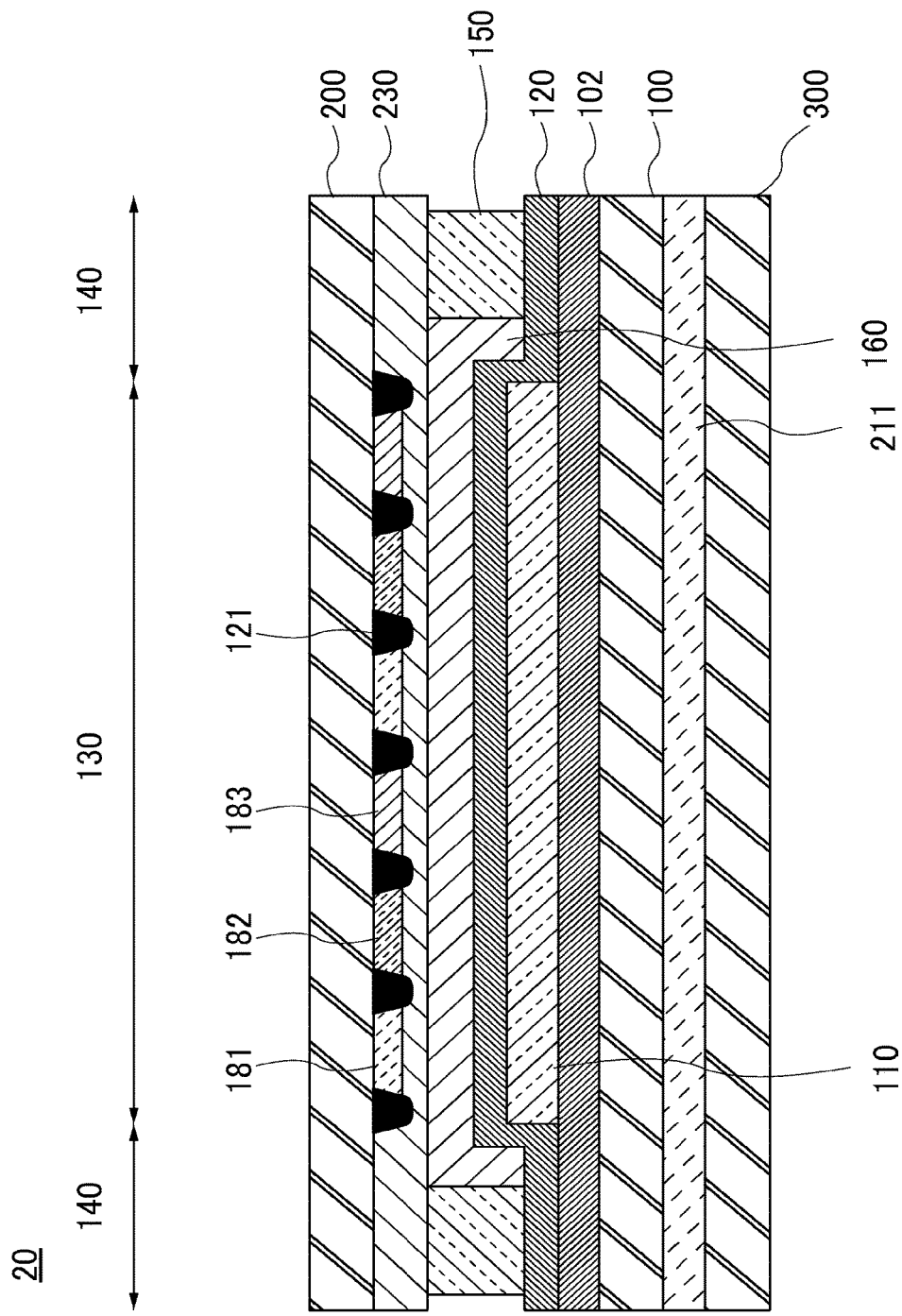
FIG. 6 is a cross-sectional view of the display device in embodiment 2 according to the present invention.

With reference to FIG. 5 and FIG. 6, a layer structure and a device structure of a display device 20 in embodiment 2 according to the present will be described. The display device 20 in embodiment 2 is an organic EL display device having a "white +CF structure". The display device 20 includes a first tacky layer 211 and a third substrate 300 assembled to a surface of a first substrate 100 opposite to a surface thereof on which a light emitting element 110 is provided.

[Layer Structure of the Display Device 20]

FIG. 5 shows a layer structure of the display device 20 in embodiment 2 according to the present invention. As shown in FIG. 5, the display device 20 includes the first substrate 100, the light emitting element 110 located on the first substrate 100, a second substrate 200 located to face the first substrate 100 while having the light emitting element 110 therebetween, the first tacky layer 211 located on the surface of the first substrate 100 opposite to the surface thereof on which the light emitting element 110 is located, and the third substrate 300 located to face the first substrate 100 while having the first tacky layer 211 therebetween.

The first tacky layer 211 may be substantially the same layer as the tacky layer 210 shown in FIG. 1. More specifically, the first tacky layer 211 is kept tacky even after being peeled off. The tack strength between the first tacky layer 211 and the first substrate 100 or the third substrate 300 is weaker than the adhesive strength between one of the pair of electrodes and the organic material included in the light emitting element 110. In the case where the light emitting layer 110 includes a stack of a plurality of organic materials, the tack strength between the first tacky layer 211 and the first substrate 100 or the third substrate 300 is weaker than the adhesive strength between the plurality of organic materials in the stack. The "tack strength between the first tacky layer 211 and the first substrate 100 or the third substrate 300" encompasses the tack strength in the case where another layer is located between the first tacky layer 211 and the first substrate 100 or the third substrate 300. The first tacky layer 211 is located on the side of the display device 20 opposite to the side on which the light from the light emitting element 110 is emitted, and therefore is not required to be highly light-transmissive. This allows the first tacky layer 211 to be formed of any of various tacky materials. The first substrate 100, the light emitting element 110, the second substrate 200 and the third substrate 300 may be those described in embodiment 1.

[Device structure of the display device 20]

A structure of the display device 20 in embodiment 2 according to the present invention will be described in detail. A plan view of the display device 20 is substantially the same as FIG. 2. Therefore, the plan view is omitted and only the cross-sectional view is provided.

FIG. 6 is a cross-sectional view of the display device 20 in embodiment 2 according to the present invention. As shown in FIG. 6, the display device 20 is similar to the display device 10 shown in FIG. 3. Unlike the display device 10, however, the display device 20 does not include any tacky layer or any substrate on a surface of the second substrate 200 opposite to a surface thereof facing the light emitting element 110, but includes the first tacky layer 211 and the third substrate 300 on the surface of the first substrate 100 opposite to the surface thereof on which the light emitting element 110 is provided. FIG. 6 shows a structure in which the first tacky layer 211 and the third substrate 300 are located on the entire surface of the first substrate 100. The present invention is not limited to having such a structure. For example, the first tacky layer 211 and the third substrate 300 may be located in a part of the display area 130 or the peripheral area 140. FIG. 6 shows a structure in which the first tacky layer 211 and the third substrate 300 are formed in the same area. The present invention is not limited to having such a structure. The first tacky layer 211 and the third substrate 300 may be located in different areas from each other. In other words, the first tacky layer 211 and the third substrate 300 may have different patterns from each other.

As described above, with the display device 20 in embodiment 2 according to the present invention, even if an external impact is applied to the display device 20, the first tacky layer 211 is peeled off from the first substrate 100 or the third substrate 300 to absorb the impact. The first tacky layer 211 and the first substrate 100 or the third substrate 300, even if being peeled off from each other by the impact, are re-attached to each other. Therefore, the external appearance of the display device 20 is kept normal. In addition, the first tacky layer 211 is not visually recognized by a viewer. Therefore, even if the first tacky layer 211 is not completely re-attached to the first substrate 100 or the third substrate 300, this is not easily recognized as a display fault. This decreases display faults such as light emission faults, non-uniform display or the like, which may be caused by the external impact.

<Modification 1 of Embodiment 2>

Figure 7:
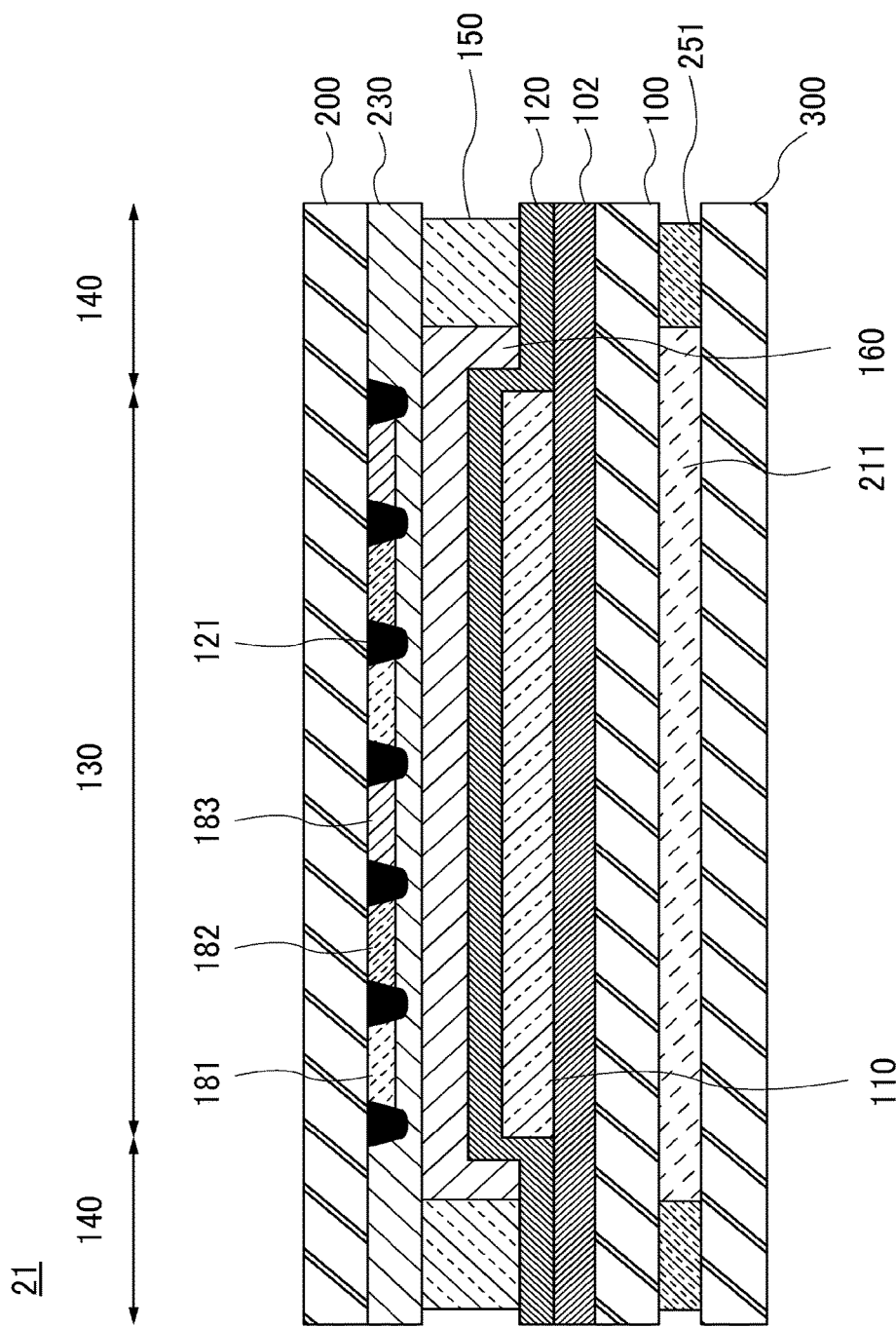
FIG. 7 is a cross-sectional view of a display device in modification 1 of embodiment 2 according to the present invention.

FIG. 7 is a cross-sectional view of a display device 21 in modification 1 of embodiment 2 according to the present invention. In modification 1 of embodiment 2, the first substrate 100 and the third substrate 300 are fixed to each other with a first adhesive layer 251.

The display device 21 shown in FIG. 7 is similar to the display device 20 shown in FIG. 6. Unlike the display device 20, however, the display device 21 includes the first adhesive layer 251 located between the first substrate 100 and the third substrate 300 so as to enclose the first tacky layer 211. Unlike the first tacky layer 211, the first adhesive layer 251 is cured after the first substrate 100 and the third substrate 300 are assembled together while having the first adhesive layer 251 therebetween. Therefore, the first substrate 100 and the third substrate 300 are fixed to each other with the first adhesive layer 251. Like in the modification of embodiment 1, the first adhesive layer 251 does not necessarily need to completely enclose the first tacky layer 211. The first adhesive layer 251 may be located in the display area 130.

As described above, the display device 21 includes the first adhesive layer 251. This increases the force that keeps the first substrate 100 and the third substrate 300 together. Even if a large external impact is applied to the display device 21, the first substrate 100 and the third substrate 300 are prevented from being completely peeled off from each other.

Modification 2 of Embodiment 2>

Figure 8:
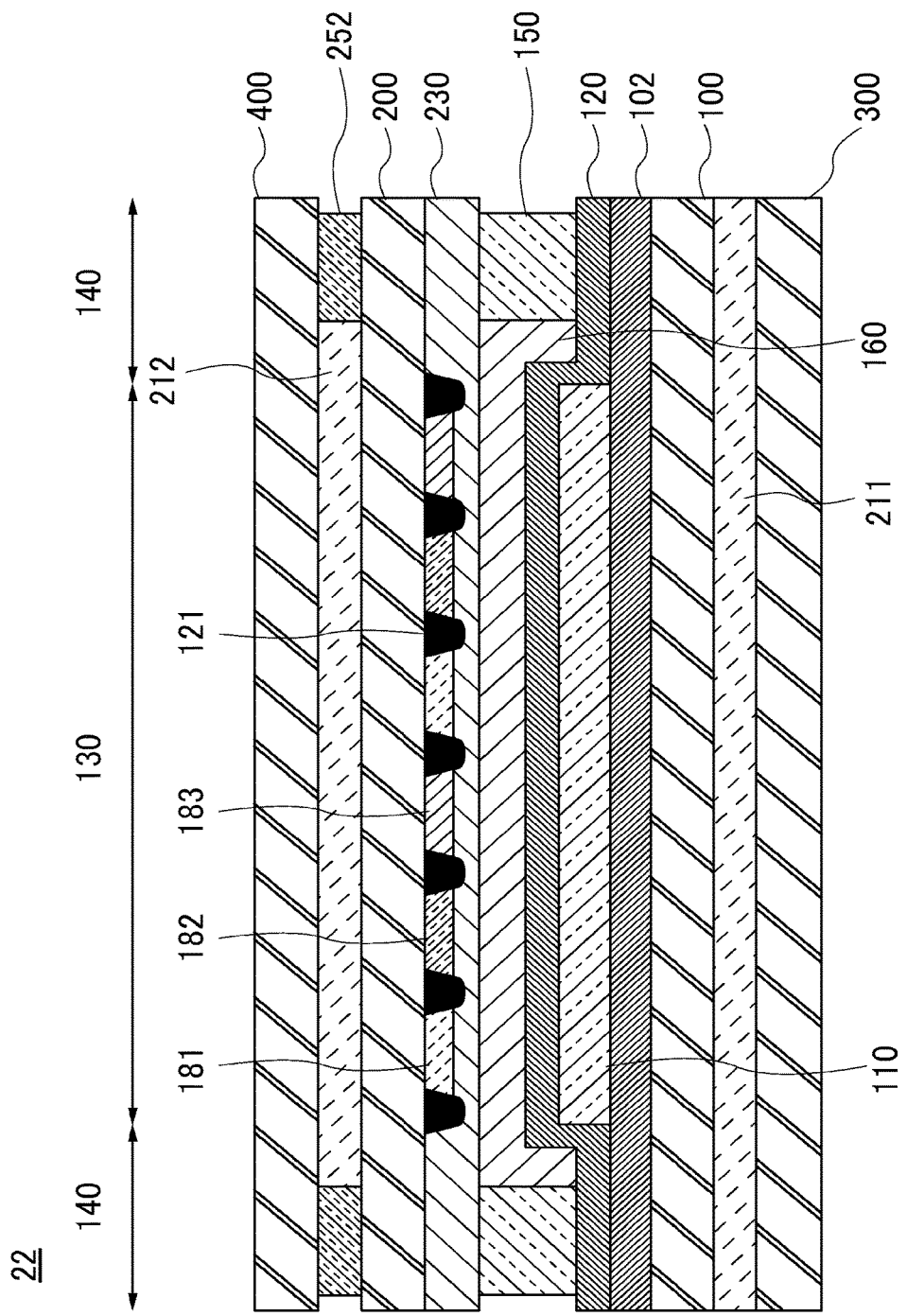
FIG. 8 is a cross-sectional view of a display device in modification 2 of embodiment 2 according to the present invention.

FIG. 8 is a cross-sectional view of a display device 22 in modification 2 of embodiment 2 according to the present invention. In modification 2 of embodiment 2, the display device 22 includes the first tacky layer 211 located between the first substrate 100 and the third substrate 300 and also includes a second tacky layer 212 and a fourth substrate 400 that are located on the second substrate 200 side.

The display device 22 shown in FIG. 8 is similar to the display device 20 shown in FIG. 6. Unlike the display device 20, however, the display device 22 includes the second tacky layer 212 located on the surface of the second substrate 200 opposite to the surface thereof facing the light emitting element 110, the fourth substrate 400 located to face the second substrate 200 while having the second tacky layer 212 therebetween, and a second adhesive layer 252 located between the second substrate 200 and the fourth substrate 400 so as to enclose the second tacky layer 212.

The second tacky layer 212 may be substantially the same layer as the tacky layer 210 shown in FIG. 1. More specifically, the second tacky layer 212 is kept tacky even after being peeled off. The tack strength between the second tacky layer 212 and the second substrate 200 or the fourth substrate 400 is weaker than the adhesive strength between one of the pair of electrodes and the organic material included in the light emitting element 110. In the case where the light emitting layer 110 includes a stack of a plurality of organic materials, the tack strength between the second tacky layer 212 and the second substrate 200 or the fourth substrate 400 is weaker than the adhesive strength between the plurality of organic materials in the stack. The "tack strength between the second tacky layer 212 and the second substrate 200 or the fourth substrate 400" encompasses the tack strength in the case where another layer is located between the second tacky layer 212 and the second substrate 200 or the fourth substrate 400.

As described above, the display device 22 includes the third substrate 300 and the fourth substrate 400 respectively on outer sides of the first substrate 100 and the second substrate 200, which have the light emitting element 110 therebetween. The first substrate 100 and the third substrate 300 have the first tacky layer 211 therebetween, and the second substrate 200 and the fourth substrate 400 have the second tacky layer 212 therebetween. Owing to this structure, the display device 22 more absorbs an external impact. This decreases display faults such as light emission faults, non-uniform display or the like.

<Embodiment 3>

Figure 9:
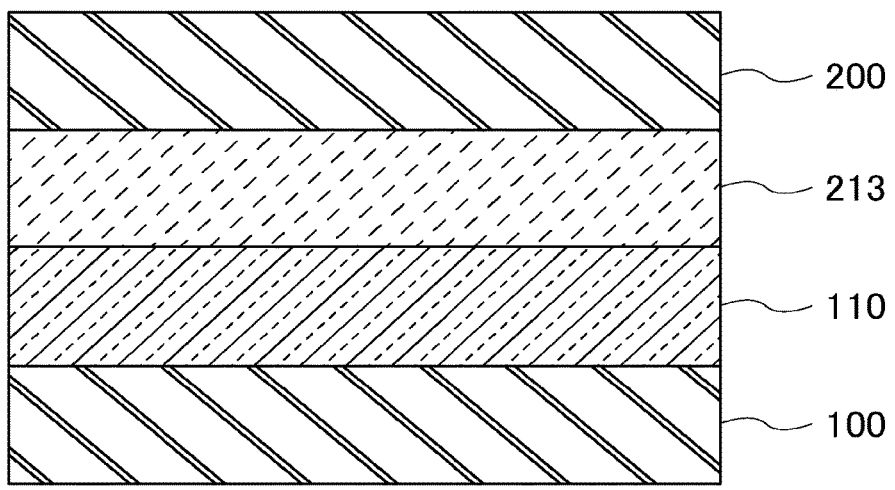
FIG. 9 shows a layer structure of a display device in embodiment 3 according to the present invention.
Figure 10:
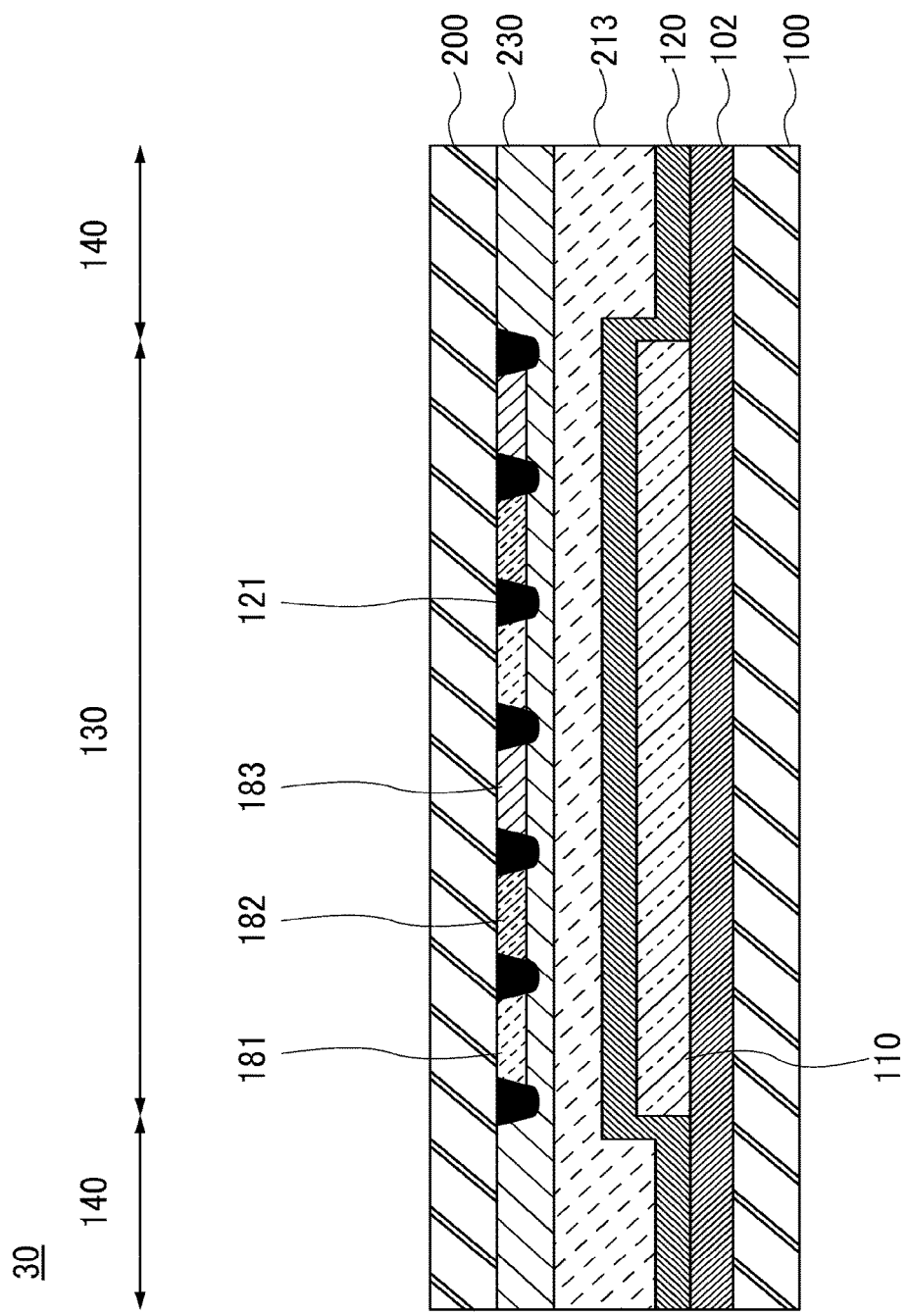
FIG. 10 is a cross-sectional view of the display device in embodiment 3 according to the present invention.

With reference to FIG. 9 and FIG. 10, a layer structure and a device structure of a display device 30 in embodiment 3 according to the present will be described. The display device 30 in embodiment 3 is an organic EL display device having a "white+CF structure". In the display device 30, a pair of substrates having a light emitting element 110 therebetween (i.e., the first substrate 100 and the second substrate 200) are assembled together with a first a tacky layer 213. In a top emission-type organic EL display device, if a gap between the light emitting element and the color filters is too large, a problem of so-called color mixing occurs; namely, light released from a light emitting element of one pixel is output to the outside of the display device after passing a color filter corresponding to a color of a pixel adjacent to the one pixel. Therefore, the first tacky layer 213 is required to have a thickness with which color mixing does not occur.

[Layer Structure of the Display Device 30]

FIG. 9 shows a layer structure of the display device 30 in embodiment 3 according to the present invention. As shown in FIG. 9, the display device 30 includes the first substrate 100, the light emitting element 110 located on the first substrate 100, the first tacky layer 213 located on the light emitting element 110 and having a thickness of 10 pm or less, and the second substrate 200 located to face the first substrate 100 while having the light emitting element 110 and the first tacky layer 213 therebetween. The thickness of the first tacky layer 213 is 10 µm or less, so that the gap between the light emitting element 110 and color filters 181 through 183 located on the second substrate 200 is sufficiently small to suppress color mixing.

The first tacky layer 213 may be substantially the same layer as the tacky layer 210 shown in FIG. 1. More specifically, the first tacky layer 213 is kept tacky even after being peeled off. The tack strength between the first tacky layer 213 and the light emitting element 110 or the second substrate 200 is weaker than the adhesive strength between one of the pair of electrodes and the organic material included in the light emitting element 110. In the case where the light emitting layer 110 includes a stack of a plurality of organic materials, the tack strength between the first tacky layer 213 and the light emitting element 110 or the second substrate 200 is weaker than the adhesive strength between the plurality of organic materials in the stack. The "tack strength between the first tacky layer 213 and the light emitting element 110 or the second substrate 200" encompasses the tack strength in the case where another layer is located between the first tacky layer 213 and the light emitting element 110 or the second substrate 200. The first substrate 100, the light emitting element 110 and the second substrate 200 may be those described in embodiment 1.

[Device Structure of the Display Device 30]

A structure of the display device 30 in embodiment 3 according to the present invention will be described in detail. A plan view of the display device 30 is substantially the same as FIG. 2. Therefore, the plan view is omitted and only the cross-sectional view is provided.

FIG. 10 is a cross-sectional view of the display device 30 in embodiment 3 according to the present invention. As shown in FIG. 10, the display device 30 is similar to the display device 10 shown in FIG. 3. Unlike the display device 10, however, the display device 30 does not include any tacky layer or any substrate on a surface of the second substrate 200 opposite to a surface thereof facing the light emitting element 110, but includes the first tacky layer 213, instead of the sealing member 150 and the filler 160, between the first substrate 100 and the second substrate 200. In other words, the first substrate 100 and the components provided thereon, and the second substrate 200 and the components provided thereon, are assembled together with the first tacky layer 213. The thickness of the first tacky layer 213 is set to 10 μm in the display area 130, so that the gap between the light emitting element 110 and the color filters 181 through 183 is sufficiently small to suppress color mixing.

In the display area 130, a protective layer 120 is located between the first tacky layer 213 and the light emitting element 110, and the color filters 181 through 183, a light blocking layer 121 and overcoat layer 230 are located between the first tacky layer 213 and the second substrate 200. Regarding the display area 130, the tack strength between the first tacky layer 213 and the protective layer 120 may be referred to as the tack strength between the first tacky layer 213 and the light emitting element 110, and the tack strength between the first tacky layer 213 and the overcoat layer 230 may be referred to as the tack strength between the first tacky layer 213 and the second substrate 200.

In the peripheral area 140, an underlying barrier layer 102 and the protective layer 120 are located between the first tacky layer 213 and the first substrate 100. Regarding the peripheral area 140, the tack strength between the first tacky layer 213 and the protective layer 120 may be referred to as the tack strength between the first tacky layer 213 and the first substrate 100.

As described above, with the display device 30 in embodiment 3 according to the present invention, even if an external impact is applied to the display device 30, the first tacky layer 213 is peeled off from the protective layer 120 or the overcoat layer 230 to absorb the impact. The first tacky layer 213 and the protective layer 120 or the overcoat layer 230, even if being peeled off from each other by the impact, are re-attached to each other. Therefore, the external appearance of the display device 30 is kept normal. Since it is not necessary to use a filler, the manufacturing process is shortened and the material costs are decreased.

<Modification 1 of Embodiment 3>

Figure 11:
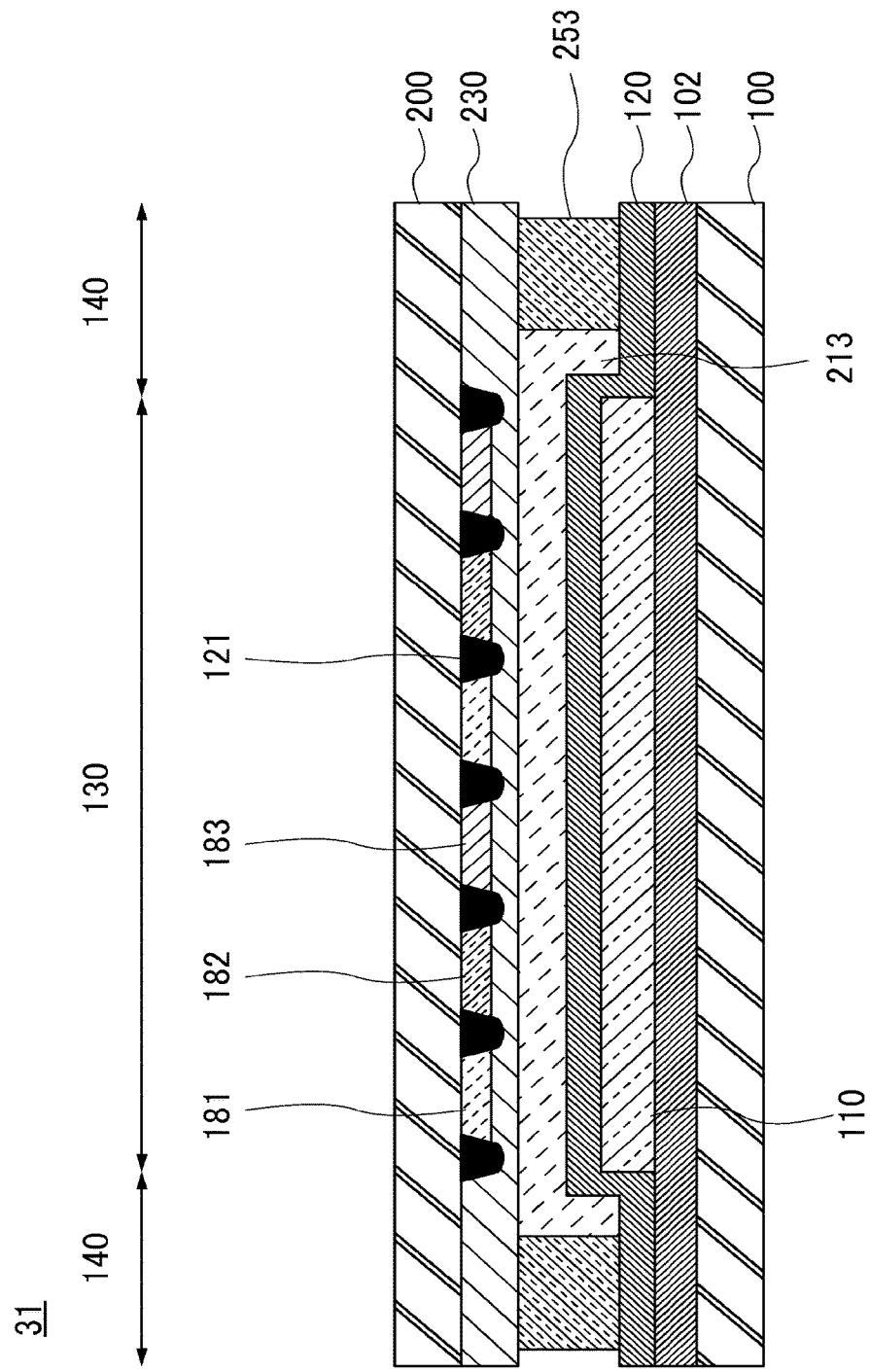
FIG. 11 is a cross-sectional view of a display device in modification 1 of embodiment 3 according to the present invention.

FIG. 11 is a cross-sectional view of a display device 31 in modification 1 of embodiment 3 according to the present invention. In modification 1 of embodiment 3, the first substrate 100 and the second substrate 200 are assembled together with the first tacky layer 213 and also with a first adhesive layer 253.

The display device 31 shown in FIG. 11 is similar to the display device 30 shown in FIG. 3. Unlike the display device 30, however, the display device 31 includes the first adhesive layer 253 located between the first substrate 100 and the second substrate 200 so as to enclose the first tacky layer 213. Unlike the tacky layer 213, the first adhesive layer 253 is cured after the first substrate 100 and the second substrate 200 are assembled together while having the first adhesive layer 253 therebetween. Therefore, the first substrate 100 and the second substrate 200 are fixed to each other with the first adhesive layer 253.

Like in the modification of embodiment 1, the adhesive layer 253 does not necessarily need to completely enclose the first tacky layer 213. The adhesive layer 253 may be located in the display area 130.

As described above, the display device 31 includes the first adhesive layer 253. This increases the force that keeps the first substrate 100 and the second substrate 200 together. Even if, for example, a large external impact is applied to the display device 31, the first substrate 100 and the second substrate 200 are prevented from being completely peeled off from each other.

<Modification 2 of Embodiment 3>

Figure 12:
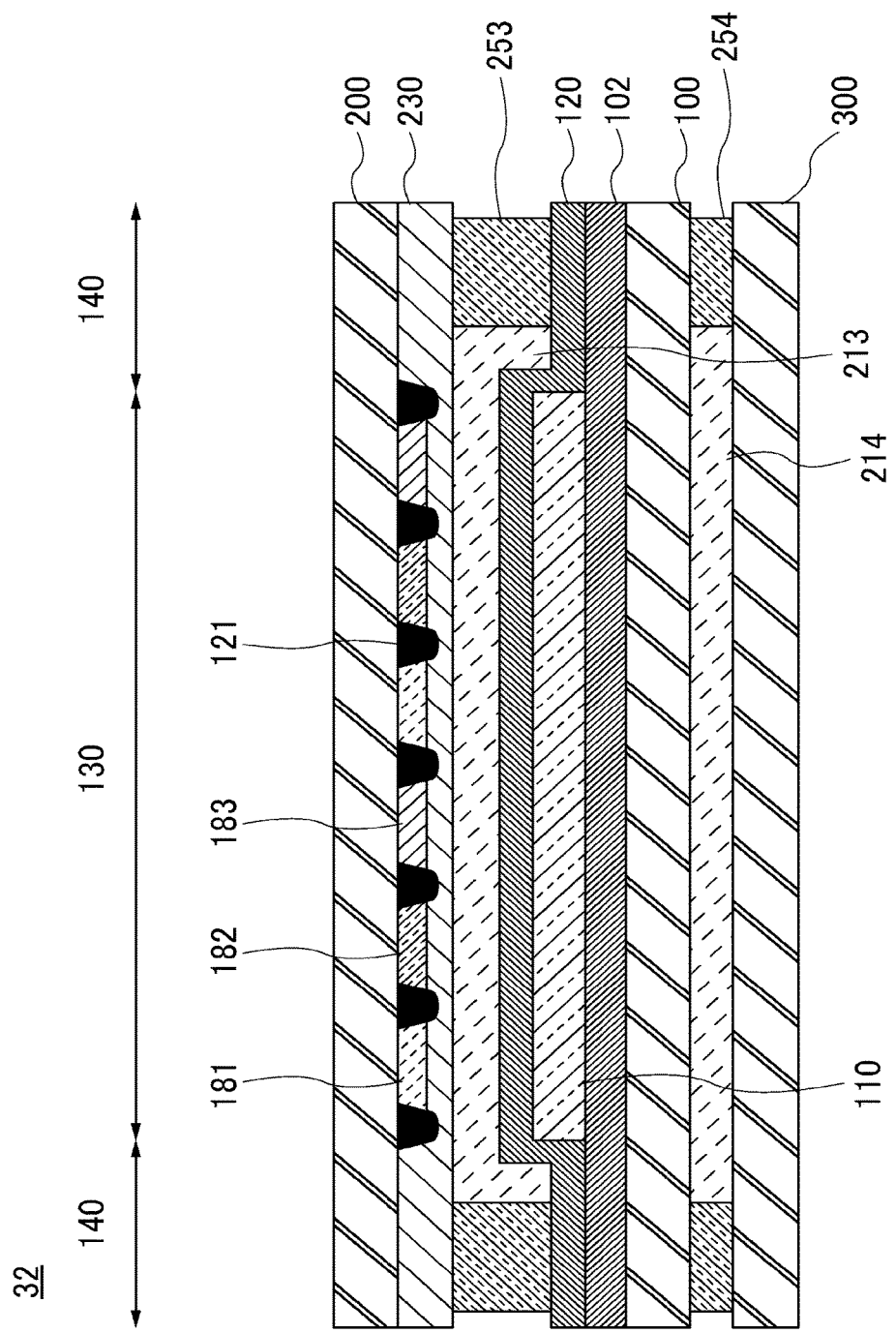
FIG. 12 is a cross-sectional view of a display device in modification 2 of embodiment 3 according to the present invention.

FIG. 12 is a cross-sectional view of a display device 32 in modification 2 of embodiment 3 according to the present invention. In modification 2 of embodiment 3, the display device 32 includes the first tacky layer 213 located between the first substrate 100 and the second substrate 200 and also includes a second tacky layer 214 and a third substrate 300 that are located on a surface of the first substrate 100 opposite to a surface thereof facing the first tacky layer 213.

The display device 32 shown in FIG. 12 is similar to the display device 31 shown in FIG. 11. Unlike the display device 31, however, the display device 32 includes the second tacky layer 214 located on the surface of the first substrate 100 opposite to the surface thereof on which the light emitting element 110 is provided, the third substrate 300 located to face the first substrate 100 while having the second tacky layer 214 therebetween, and a second adhesive layer 254 located between the first substrate 100 and the third substrate 300 so as to enclose the second tacky layer 214.

The second tacky layer 214 may be substantially the same layer as the tacky layer 210 shown in FIG. 1. More specifically, the second tacky layer 214 is kept tacky even after being peeled off. The tack strength between the second tacky layer 214 and the first substrate 100 or the third substrate 300 is weaker than the adhesive strength between one of the pair of electrodes and the organic material included in the light emitting element 110. In the case where the light emitting layer 110 includes a stack of a plurality of organic materials, the tack strength between the second tacky layer 214 and the first substrate 100 or the third substrate 300 is weaker than the adhesive strength between the plurality of organic materials in the stack. The "tack strength between the second tacky layer 214 and the first substrate 100 or the third substrate 300" encompasses the tack strength in the case where another layer is located between the second tacky layer 214 and the first substrate 100 or the third substrate 300.

<Modification 3 of Embodiment 3>

Figure 13:
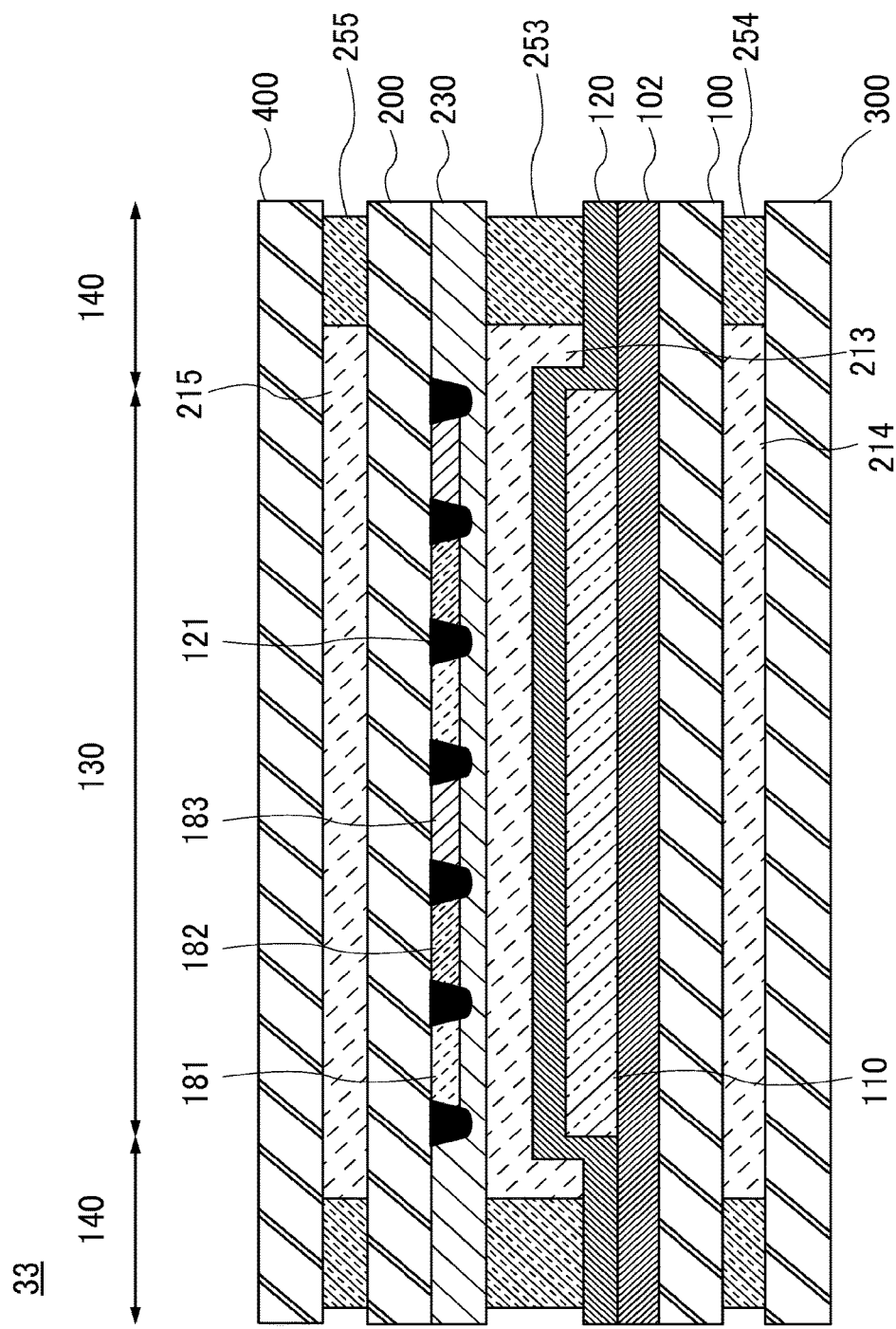
FIG. 13 is a cross-sectional view of a display device in modification 3 of embodiment 3 according to the present invention.

FIG. 13 is a cross-sectional view of a display device 33 in modification 3 of embodiment 3 according to the present invention. In modification 3 of embodiment 3, the display device 33 includes the first tacky layer 213, the second tacky layer 214, and also includes a third tacky layer 215 and a fourth substrate 400 that are located on the second substrate 200 side.

The display device 33 shown in FIG. 13 is similar to the display device 32 shown in FIG. 12. Unlike the display device 32, however, the display device 33 includes the third tacky layer 215 located on the surface of the second substrate 200 opposite to the surface thereof facing the light emitting element 110, the fourth substrate 400 located to face the second substrate 200 while having the third tacky layer 215 therebetween, and a third adhesive layer 255 located between the second substrate 200 and the fourth substrate 400 so as to enclose the third tacky layer 215.

The third tacky layer 215 may be substantially the same layer as the tacky layer 210 shown in FIG. 1. More specifically, the third tacky layer 215 is kept tacky even after being peeled off. The tack strength between the third tacky layer 215 and the second substrate 200 or the fourth substrate 400 is weaker than the adhesive strength between one of the pair of electrodes and the organic material included in the light emitting element 110. In the case where the light emitting layer 110 includes a stack of a plurality of organic materials, the tack strength between the third tacky layer 215 and the second substrate 200 or the fourth substrate 400 is weaker than the adhesive strength between the plurality of organic materials in the stack. The "tack strength between the third tacky layer 215 and the second substrate 200 or the fourth substrate 400" encompasses the tack strength in the case where another layer is located between the third tacky layer 215 and the second substrate 200 or the fourth substrate 400.

As described above, the display device 32 includes the first tacky layer 213 located between the first substrate 100 and the second substrate 200, which has the light emitting element 110 therebetween, and also includes the second tacky layer 214 and the third substrate 300 that are located on the surface of the first substrate 100 opposite to the surface thereof facing the first tacky layer 213. The display device 33 includes the first tacky layer 213, the second tacky layer 214 and the third substrate 300 as described above, and also includes the third tacky layer 215 and the fourth substrate 400 that are located on the surface of the second substrate 200 opposite to the surface thereof facing the light emitting element 110. Owing to such a structure, an external impact is more absorbed. This decreases display faults such as light emission faults, non-uniform display or the like.

<Modification 4 of Embodiment 3>

Figure 14:
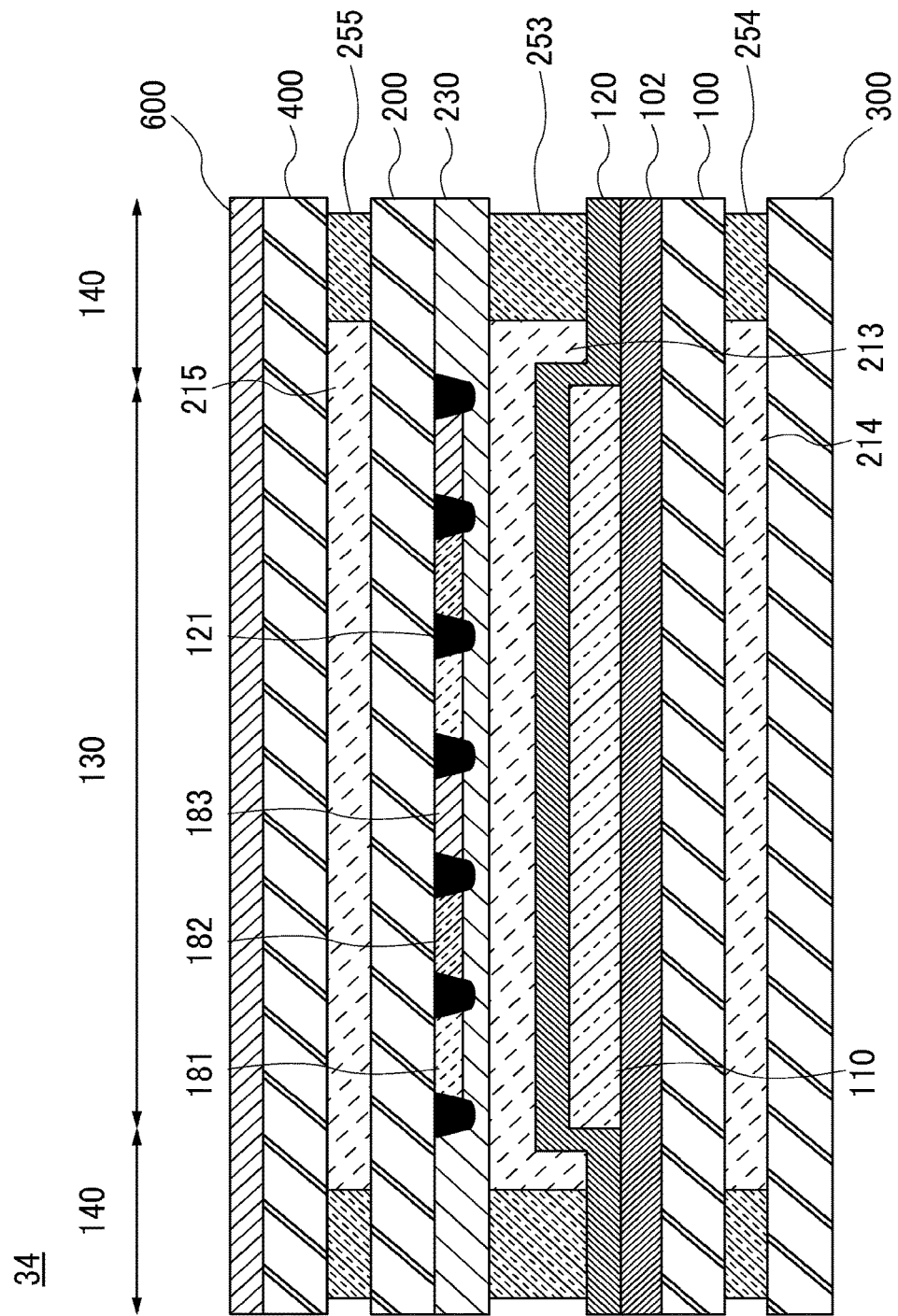
FIG. 14 is a cross-sectional view of a display device in modification 4 of embodiment 3 according to the present invention.

FIG. 14 is a cross-sectional view of a display device 34 in modification 4 of embodiment 3 according to the present invention. In modification 4 of embodiment 3, the display device 34 includes a touch sensor 600 on a surface of the fourth substrate 400 opposite to a surface thereof on which the third tacky layer 215 is provided. The display device 34 shown in FIG. 14 include the touch sensor 34 in addition to the components of the display device 33 shown in FIG. 13. The present invention is not limited to having such a structure. The touch sensor may be provided in a display device having a structure shown in any of the embodiments and modifications described above. For example, the touch sensor may be provided on a surface of the third substrate 300 (FIG. 3) opposite to a surface thereof on which the tacky layer 210 is provided.

In the case where the touch sensor is provided by use of a tacky layer, the organic light emitting layer is protected with no change in the structure of the light emitting element. Since the organic light emitting layer is isolated from the tacky layer by the second substrate 200, the tacky material is usable with no consideration of the influence on the organic light emitting layer.

The present invention is not limited to any of the above-described embodiments, and may be appropriately varied without departing from the gist of the invention.

What is claimed is:

1. A display device, comprising:
   a first substrate having a display area and a peripheral area;
   a light emitting element on the first substrate and in the display area and including a pair of electrodes and one organic layer or a plurality of organic layers between the pair of electrodes;
   a protective layer on the light emitting element;
   a touch sensor on the protective layer and
   a first tacky layer on a surface of the first substrate opposite to a surface thereof having the light emitting element located thereon, a tack strength between the first tacky layer and the first substrate being weaker than an adhesive strength between one of the pair of electrodes and the one organic layer or an adhesive strength between the plurality of organic layers.

2. The display device according to claim 1, wherein the first tacky layer is kept tacky after being peeled off.

3. The display device according to claim 1, wherein the first tacky layer is in the display area and in the peripheral area.

4. The display device according to claim 1, further comprising a first adhesive layer on the first substrate so as to enclose the first tacky layer.

5. The display device according to claim 1, further comprising a second substrate on a surface of the tacky layer opposite to a surface thereof facing the light emitting element.

6. The display device according to claim 1, further comprising:
   a third substrate between the touch sensor and the protective layer; and
   a second tacky layer between the touch sensor and the third substrate.

7. The display device according to claim 6, wherein a tack strength between the second tacky layer and the third substrate is weaker than the adhesive strength between one of the pair of electrodes and the one organic layer or the adhesive strength between the plurality of organic layers.

8. The display device according to claim 7, wherein the second tacky layer is kept tacky after being peeled off.

9. The display device according to claim 7, wherein the second tacky layer is in the display area and in the peripheral area.

* * * * *